United States Patent
Sumitomo et al.

(10) Patent No.: US 9,324,848 B2
(45) Date of Patent: Apr. 26, 2016

(54) SEMICONDUCTOR DEVICE

(71) Applicant: DENSO CORPORATION, Kariya, Aichi-pref. (JP)

(72) Inventors: Masakiyo Sumitomo, Okazaki (JP); Shigemitsu Fukatsu, Okazaki (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/395,868

(22) PCT Filed: May 28, 2013

(86) PCT No.: PCT/JP2013/003357
§ 371 (c)(1),
(2) Date: Oct. 21, 2014

(87) PCT Pub. No.: WO2013/179648
PCT Pub. Date: Dec. 5, 2013

(65) Prior Publication Data
US 2015/0129927 A1    May 14, 2015

(30) Foreign Application Priority Data
May 30, 2012    (JP) .................................. 2012-122822

(51) Int. Cl.
*H01L 29/739* (2006.01)
*H01L 29/66* (2006.01)
(Continued)

(52) U.S. Cl.
CPC ........ *H01L 29/7395* (2013.01); *H01L 29/0839* (2013.01); *H01L 29/4236* (2013.01); *H01L 29/4238* (2013.01); *H01L 29/66325* (2013.01); *H01L 29/7397* (2013.01); *H01L 29/7827* (2013.01)

(58) Field of Classification Search
None
See application file for complete search history.

(56) References Cited

U.S. PATENT DOCUMENTS 5,608,238 A    3/1997 Matsuda
5,864,159 A *  1/1999 Takahashi ..................... 257/330
(Continued)

FOREIGN PATENT DOCUMENTS

JP    2004-319624 A    11/2004
JP    2005-191221 A    7/2005
(Continued)

OTHER PUBLICATIONS

Office Action mailed Feb. 17, 2015 issued in corresponding JP patent application No. 2012-122822 (and English translation).
(Continued)

*Primary Examiner* — Eduardo A Rodela
(74) *Attorney, Agent, or Firm* — Posz Law Group, PLC

(57) ABSTRACT

A semiconductor device includes a first conductivity-type drift layer, a second conductivity-type base layer formed in a front surface portion of the drift layer, a second conductivity-type collector layer formed in the drift layer and separated from the base layer, gate insulation layers formed on a surface of the base layer, gate electrodes individually formed on the gate insulation layers, an emitter layer formed in a front surface portion of the base layer, an emitter electrode electrically connected to the emitter layer and the base layer, and a collector electrode electrically connected to the collector layer. A rate of change in a gate voltage of a part of the gate electrodes is smaller than a rate of change in a gate voltage of a remainder of the gate electrodes. The emitter layer is in contact with only the gate insulation layers provided with the part of the gate electrodes.

4 Claims, 7 Drawing Sheets

(51) Int. Cl.
  *H01L 29/423* (2006.01)
  *H01L 29/08* (2006.01)
  *H01L 29/78* (2006.01)

(56) References Cited

U.S. PATENT DOCUMENTS

| | | | |
|---|---|---|---|
| 6,114,727 A * | 9/2000 | Ogura et al. | 257/342 |
| 6,153,896 A * | 11/2000 | Omura et al. | 257/139 |
| 6,472,693 B1 * | 10/2002 | Takahashi et al. | 257/167 |
| 2004/0084722 A1 * | 5/2004 | Yamaguchi et al. | 257/330 |
| 2005/0017290 A1 * | 1/2005 | Takahashi et al. | 257/328 |
| 2005/0161768 A1 * | 7/2005 | Sugiyama et al. | 257/565 |
| 2011/0001553 A1 * | 1/2011 | Soeno et al. | 327/534 |
| 2012/0056241 A1 | 3/2012 | Sumitomo et al. | |
| 2012/0146091 A1 * | 6/2012 | Tanabe et al. | 257/139 |
| 2013/0037853 A1 * | 2/2013 | Onozawa | 257/139 |

FOREIGN PATENT DOCUMENTS

| | | |
|---|---|---|
| JP | 2008-305956 A | 12/2008 |
| JP | 2010-123667 A | 6/2010 |
| JP | 2010-135676 A | 6/2010 |
| WO | 2013/065247 A1 | 5/2013 |

OTHER PUBLICATIONS

International Search Report and Written Opinion of the International Searching Authority mailed Sep. 3, 2013 in the corresponding PCT application No. PCT/JP2013/003357 (and English translation).

* cited by examiner

SEMICONDUCTOR DEVICE

CROSS REFERENCE TO RELATED APPLICATION

The present disclosure is a U.S. national stage application of PCT/JP2013/003357 filed on May 28, 2013, and is based on Japanese Patent Application No. 2012-122822 filed on May 30, 2012, the contents of which are incorporated herein by reference.

TECHNICAL FIELD

The present disclosure relates to a semiconductor device having an insulated-gate bipolar transistor (hereinafter referred to simply as the IGBT) element.

BACKGROUND ART

A semiconductor device having an IGBT element used in an electronic apparatus such as an industrial motor has been known as a semiconductor power conversion device. It has been proposed to reduce a surge voltage at the time of turn-off in this type of semiconductor device (for example, refer to a patent document 1).

For example, in a trench gate IGBT element, an $N^-$-type drift later is formed on a $P^+$-type collector layer, and a P-type base layer is formed in a surface portion of the drift layer. Then, an $N^+$-type emitter layer is formed in a surface portion of the base layer. Further, multiple trenches which reach the drift layer by penetrating the base layer and the emitter layer are formed in a pattern of stripes. A gate insulation layer and a gate electrode are formed in order on a wall of each trench so that a trench gate structure can be formed with the trench, the gate insulation layer, and the gate electrode. Further, an emitter electrode is formed on the base layer and the emitter layer through an interlayer dielectric film. The emitter electrode is electrically connected to the base layer and the emitter layer through a contact hole formed in the interlayer dielectric film. Further, a collector electrode is formed on a back side of a collector layer and electrically connected to the collector layer.

In the semiconductor device having the IGBT element, a predetermined voltage is applied to a part of the gate electrodes through a first resistor and applied to a remainder of the gate electrodes through a second resistor having a resistance smaller than that of the first resistor.

Thus, when the IGBT element is turned off, a turn-off voltage is applied to the part of the gate electrodes through the first resistor while applied to the remainder of the gate electrodes through the second resistor. Therefore, a gate voltage of the remainder of the gate electrodes decreases faster than a gate voltage of the part of the gate electrodes.

For this reason, before the gate voltage of the part of the gate electrodes becomes smaller than a threshold voltage (hereinafter simply referred to as the threshold voltage) of the gate of a MOS, the gate voltage of the remainder of the gate electrodes can become smaller than the threshold voltage. Accordingly, a collector current can be reduced in advance. Then, when the gate voltage of the part of the gate electrodes becomes smaller than the threshold voltage, the collector current becomes zero, and the IGBT element is turned off. That is, the collector current can be reduced stepwise by causing the gate voltage of each gate electrode to be smaller than the threshold voltage at a different time. Thus, a magnitude of the surge voltage can be reduced as compared to when the gate voltage of each electrode is caused to be smaller than the threshold voltage at a time.

PRIOR ART

Patent Document

Patent Document 1: JP-A-2004-319624

SUMMARY OF THE INVENTION

However, in the semiconductor device having the IGBT element disclosed in the patent document 1, since the IGBT element is turned on by applying a turn-on voltage to the remainder of the gate electrodes, the gate voltage of the remainder of the gate electrodes increases too fast. Accordingly, a period of time from when the IGBT element is turned on to when a current reaches a predetermined value may become too short, and the surge voltage may become large enough to destroy the IGBT element. That is, in the above semiconductor device having the IGBT element, although the surge voltage at the time of turn-off may be reduced, the surge voltage at the time of turn-on may be increased.

It is noted that occurrence of this type of phenomenon is not limited to when a predetermined voltage is applied to a part of multiple gate electrodes through a first resistor and applied to a remainder of the gate electrodes through a second resistor having a resistance smaller than that of the first resistor. That is, the phenomenon can occur in a semiconductor device in which a rate of change (a rate of increase and a rate of decrease) in the gate voltage of the remainder of the gate electrodes is faster than a rate of change (a rate of increase and a rate of decrease) in the gate voltage of the part of the gate electrodes.

Further, the phenomenon can occur in a planar gate semiconductor device in the same manner as in a trench gate semiconductor device and also can occur in a semiconductor device having a P-channel IGBT element in the same manner as in a semiconductor device having a N-channel IGBT element.

In view of the above, it is an object of the present disclosure to provide a semiconductor device having an IGBT element in which a surge voltage at the time of turn-on is reduced while a surge voltage at the time of turn-off is reduced.

According to a first aspect of the present disclosure, a semiconductor device includes a first conductivity-type drift layer, a second conductivity-type base layer formed in a front surface portion of the drift layer, a second conductivity-type collector layer formed in the drift layer and separated from the base layer, gate insulation layers formed on a surface of the base layer, gate electrodes individually formed on the gate insulation layers, an emitter layer formed in a front surface portion of the base layer, an emitter electrode electrically connected to the emitter layer and the base layer, and a collector electrode electrically connected to the collector layer. A rate of change in a gate voltage of a part of the gate electrodes is smaller than a rate of change in a gate voltage of a remainder of the gate electrodes.

The emitter layer is in contact with only the gate insulation layers provided with the part of the gate electrodes and is not in contact with the gate insulation layers provided with the remainder of the gate electrodes.

As described above, the emitter layer is not in contact with the gate insulation layers provided with the remainder of the gate electrodes. Therefore, even when a turn-on voltage is applied to the remainder of the gate electrodes so that the gate voltage can exceed a threshold voltage, electrons are not supplied to the drift layer, and an IGBT element is not turned on. That is, turn-on of the IGBT element is controlled by the part of the gate electrodes whose gate voltage increases at a rate smaller than a rate at which the gate voltage of the remainder of the gate electrodes increases. Thus, a surge voltage at the time of the turn-on of the IGBT element can be reduced while a surge voltage at the time of a turn-off is reduced.

BRIEF DESCRIPTION OF THE DRAWINGS

The above and other objects, features and advantages of the present disclosure will become more apparent from the following detailed description made with reference to the accompanying drawings. In the drawings.

EMBODIMENTS OF THE INVENTION

Embodiments of the present disclosure are described below with reference to the drawings. Throughout the embodiments, like characters of reference indicate the same or equivalent parts.

First Embodiment

Figure 1:
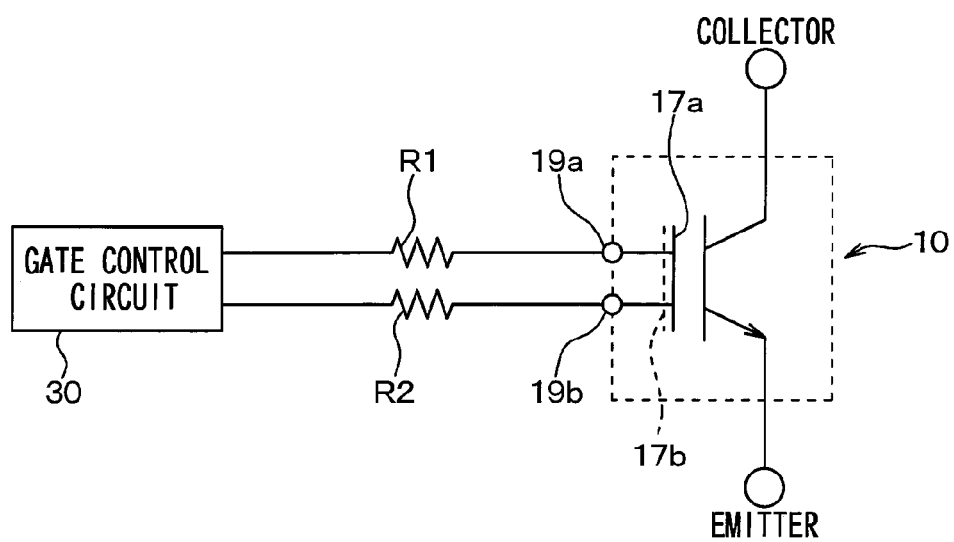
FIG. 1 is a diagram illustrating a circuit structure of a semiconductor device according to a first embodiment of the present disclosure.

A first embodiment of the present disclosure is described. As shown in FIG. 1, in a semiconductor device according to the present embodiment, a semiconductor chip 10 having an IGBT element is connected to a gate control circuit 30. Firstly, a structure of the semiconductor chip 10 is described.

Figure 2:
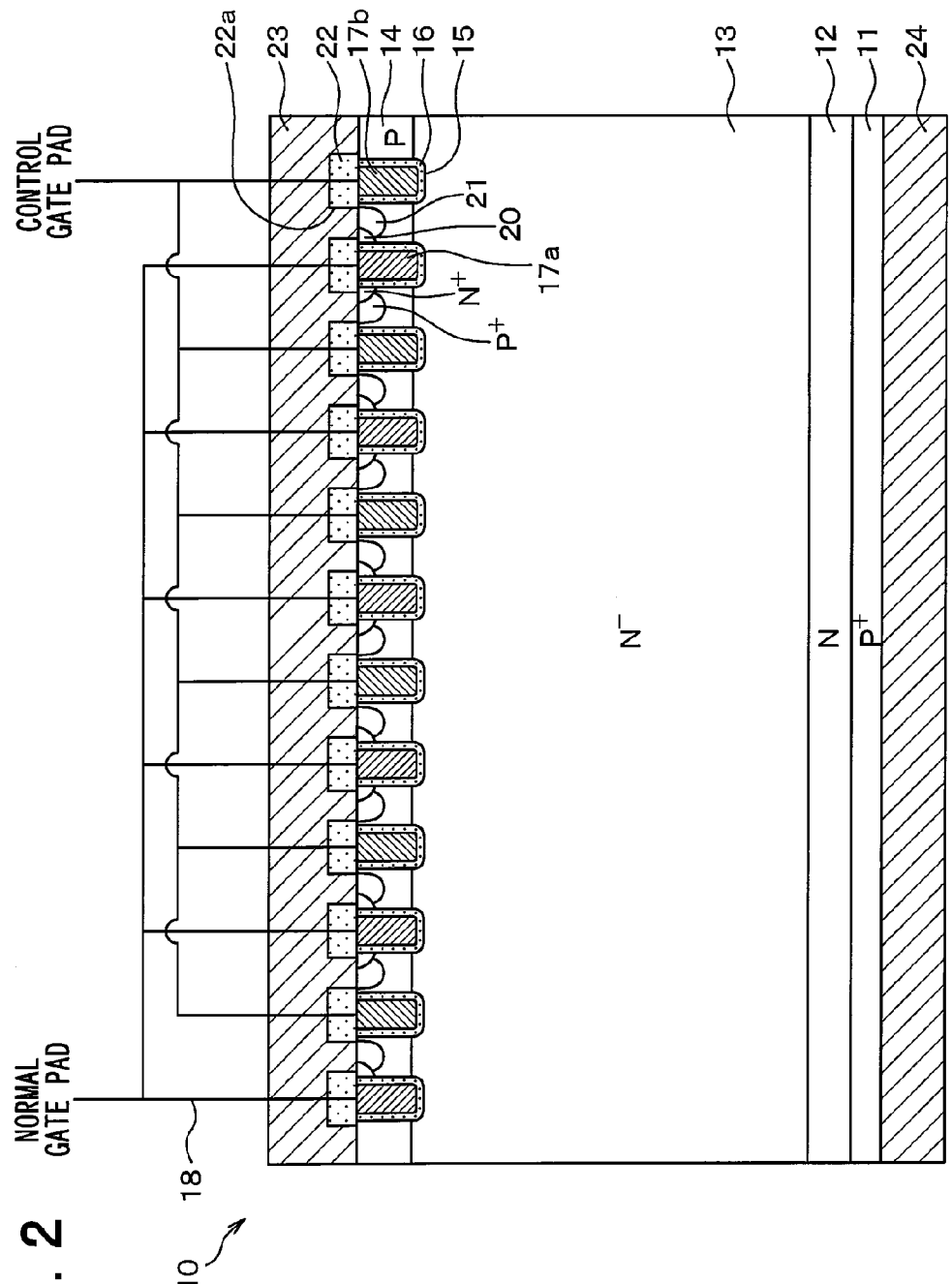
FIG. 2 is a cross sectional view of a semiconductor chip shown in FIG. 1.

As shown in FIG. 2, in the semiconductor chip 10, an N-type field stop layer (hereinafter referred to as a FS layer) 12 is formed on a P$^+$-type collector layer 11, and a N$^-$-type drift layer 13 is formed on the FS layer 12. Although the FS layer 12 is not always essential, it is formed to prevent expansion of a depletion layer so that performances for a breakdown voltage and a steady loss can be improved. A P-type base layer 14 is formed in a front surface portion of the drift layer 13. That is, the base layer 14 is separated from the collector layer 11 across the drift layer 13.

Further, multiple trenches 15 which reach the drift layer 13 by penetrating the base layer 14 are formed. According to the present embodiment, these trenches 15 are arranged at a predetermined interval (pitch) and extend in parallel to each other in a predetermined direction (a direction perpendicular to plane of paper in FIG. 1) to form a stripe structure.

Each trench 15 is filled with a gate insulation layer 16 and gate electrodes 17a, 17b so that a trench gate can be formed.

The gate insulation layer 16 is made of thermally-oxidized film, etc. and covers a surface of an inner wall of the trench 15. The gate electrodes 17a, 17b are made of polysilicon, etc. and formed on the gate insulation layer 16.

Figure 3:
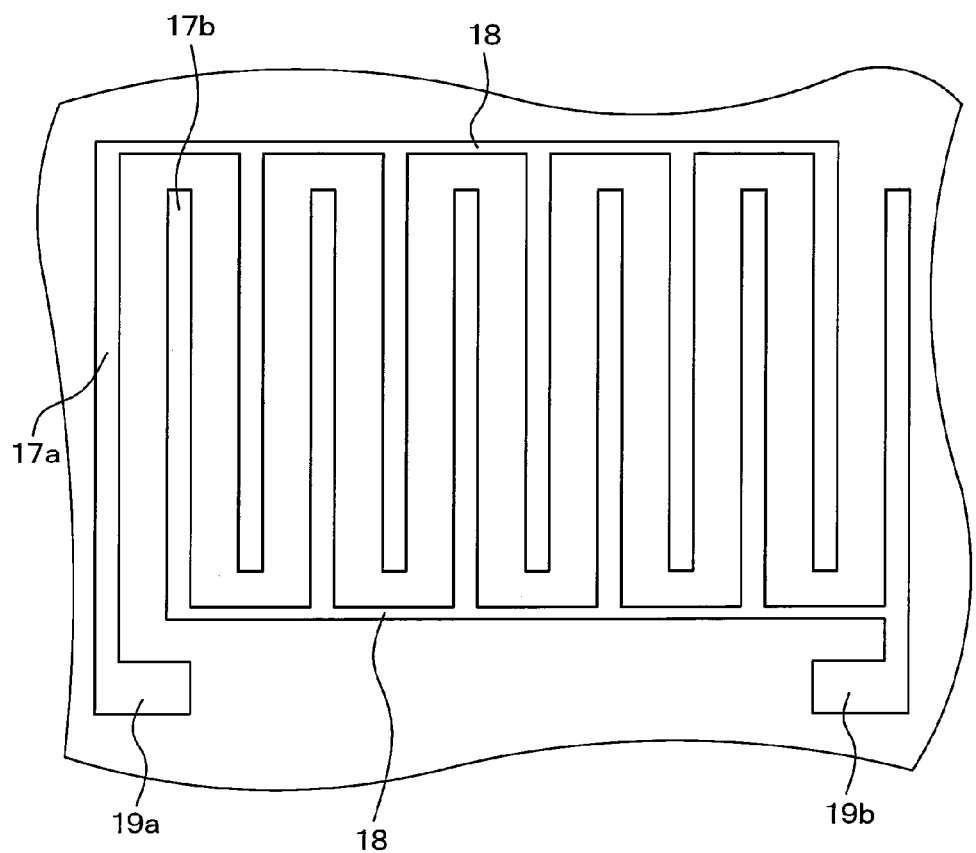
FIG. 3 is a plan view illustrating an arrangement of gate electrodes shown in FIG. 2.

As shown in FIG. 3, the gate electrodes 17a, 17b alternate in a direction (a right-left direction along plane of paper in FIG. 1) perpendicular to a direction in which the trenches 15 extend. The gate electrode 17a is connected to a gate pad 19a through a gate wire 18, and the gate electrode 17b is connected to a gate pad 19b through a gate wire 18.

The gate electrode 17a, the gate electrode 17b, the gate pad 19a, and the gate pad 19b are hereinafter referred to as a normal gate electrode 17a, a control gate electrode 17b, a normal gate pad 19a, and a control gate pad 19b, respectively. According to the present embodiment, the normal gate electrode 17a corresponds to a part of multiple gate electrodes in the present disclosure, and the control gate electrode 17b corresponds to a remainder of multiple gate electrodes in the present disclosure. For example, the gate wire 18 can be formed by patterning polysilicon which is used to form the gate electrodes 17a, 17b.

Further, as shown in FIG. 2, an N$^+$-type emitter layer 20 is formed in a front surface portion of the base layer 14. Specifically, in the front surface portion of the base layer 14, the emitter layer 20 is in contact with only the gate insulation layer 16 provided with the normal gate electrode 17a, and the emitter layer 20 is not in contact with the gate insulation layer 16 provided with the control gate electrode 17a. In other words, the emitter layer 20 is in contact with only a side surface of the trench 15 filled with the normal gate electrode 17a, and the emitter layer 20 is not in contact with a side surface of the trench 15 filled with the control gate electrode 17b. The emitter layer 20 extends like a rod along a longitudinal direction of the trench 15 and is terminated at a position short of a tip of the trench 15.

Further, a P$^+$-type body layer 21 is formed at a position separated from the side surface of each trench 15. The body layer 21 also extends like a rod along the longitudinal direction of the trench 15 and is terminated at a position short of the tip of the trench 15. The emitter layer 20 and the body layer 21 are higher in concentration than the base layer 14 and terminated inside the base layer 14.

Further, an interlayer dielectric 22 made of BPSG, etc. is formed on the base layer 14. The interlayer dielectric 22 has a contact hole 22a to which the body layer 21 and part of the emitter layer 20 are exposed. An emitter electrode 23 is formed on the interlayer dielectric 22 and electrically connected to the emitter layer 20 and the body layer 21 through the contact hole 22a.

Although not shown in the drawings, the gate wire 18, the normal gate pad 19a, and the control gate pad 19b are formed on the interlayer dielectric 22 in a cross-section different from that shown in FIG. 1.

Further, a collector electrode 24 is formed on a back surface side of the collector layer 11 and electrically connected to the collector layer 11.

The semiconductor chip 10 according to the present embodiment is structured in the above manner. According to the present embodiment, N-type, N$^-$-type, and N$^+$-type correspond to a first conductivity type in the present disclosure, and P-type, P$^-$-type, and P$^+$-type correspond to a second conductivity type in the present disclosure.

As shown in FIG. 1, the semiconductor chip 10 is connected to the gate control circuit 30 having a circuit chip, etc. Specifically, the normal gate electrode 17a is connected to the gate control circuit 30 through the normal gate pad 19a and a first resistor R1, and the control gate electrode 17b is connected to the gate control circuit 30 through the control gate pad 19b and a second resistor R2 which has a resistance smaller than the first resistor R1. That is, in the semiconductor device according to the present embodiment, a rate of change (a rate of increase and a rate of decrease) in a gate voltage of the normal gate electrode 17a is smaller than a rate of change (a rate of increase and a rate of decrease) in a gate voltage of the control gate electrode 17b.

The semiconductor device according to the present embodiment is structured in the above manner. Next, turn-on and turn-off of the IGBT element are described with reference to FIGS. 4A and 4B.

Figure 4A:
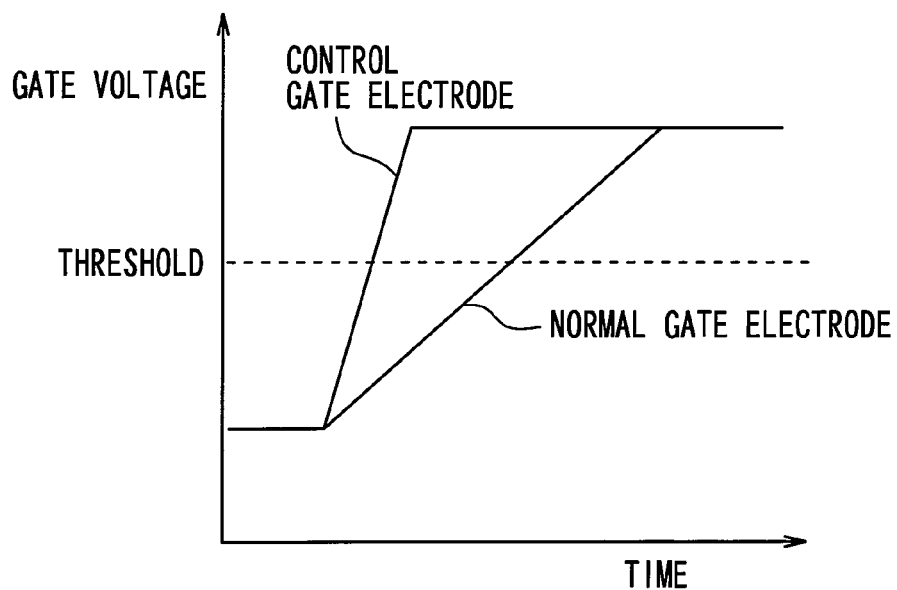
FIG. 4A is a diagram illustrating a relationship between a gate voltage and a time when a turn-on voltage is applied.

Firstly, the turn-on of the IGBT element is described with reference to FIG. 4A. When the IGBT element is to be turned on, the gate control circuit 30 applies a turn-on voltage to the normal gate electrode 17a through the first resistor R1 while applying the turn-on voltage to the control gate electrode 17b through the second resistor R2. Accordingly, a rate of increase in charge stored in a gate capacitance of the normal gate electrode 17a becomes smaller than a rate of increase in charge stored in a gate capacitance of the control gate electrode 17b. That is, a rate of increase in the gate voltage of the normal gate electrode 17a becomes smaller than a rate of increase in the gate voltage of the control gate electrode 17b.

Therefore, the gate voltage of the control gate electrode 17b exceeds the threshold voltage before the gate voltage of the normal gate electrode 17a, and an N-type inversion layer is produced in a portion of the base layer 14 in contact with the trench 15 filled with the control gate electrode 17b.

However, in the IGBT element according to the present embodiment, the emitter layer 20 is not in contact with the side surface of the trench 15 filled with the control gate electrode 17b. For this reason, even when the gate voltage of the control gate electrode 17b exceeds the threshold voltage, electrons are not supplied from the emitter electrode 23 to the drift layer 13. Therefore, even when the gate voltage of the control gate electrode 17b exceeds the threshold voltage, the IGBT element is not turned on.

After that, when the gate voltage of the normal gate electrode 17a exceeds the threshold voltage, an N-type inversion layer is produced in a portion of the base layer 14 in contact with the trench 15 filled with the normal gate electrode 17a. Since the emitter layer 20 is in contact with the side surface of the trench 15 filled with the normal gate electrode 17a, electrons are supplied from the emitter layer 20 to the drift layer 13 through the inversion layer while holes are supplied from the collector layer 11 to the drift layer 13. Thus, a resistance of the drift layer 13 is reduced by conductivity modulation, so that the IGBT element can be turned on.

That is, turn-on of the IGBT element can be limited by the normal gate electrode 17a. Since the rate of increase in the gate voltage of the normal gate electrode 17a is smaller than the rate of increase in the gate voltage of the control gate electrode 17b, it is possible to reduce the magnitude of the surge voltage.

It is noted that when the gate voltage of the normal gate electrode 17a exceeds the threshold voltage, all the electrons are supplied to the drift layer 13 through the inversion layer produced by the normal gate electrode 17a. That is, electrons which are supplied to the drift layer 13 through the inversion layer produced by the control gate electrode 17b in a conventional IGBT element are supplied to the drift layer 13 through the inversion layer produced by the normal gate electrode 17a. Therefore, since the total number of electrons supplied to the drift layer 13 is almost the same as that in the conventional IGBT element, a significant increase in an ON-resistance can be prevented.

As describe above, when the gate voltage of the control gate electrode 17b exceeds the threshold voltage, the N-type inversion layer is produced in the portion of the base layer 14 in contact with the trench 15 filled with the control gate electrode 17b. Therefore, a region (a region where no inversion layer is produced) of the base layer 14 where holes are capable of passing during the turn-on becomes small. That is, since the application of the turn-on voltage to the control gate electrode 17b prevents the holes supplied to the drift layer 13 from being ejected from the emitter electrode 23 through the base layer 14 and the body layer 21, it is possible to reduce an ON-voltage.

Figure 4B:
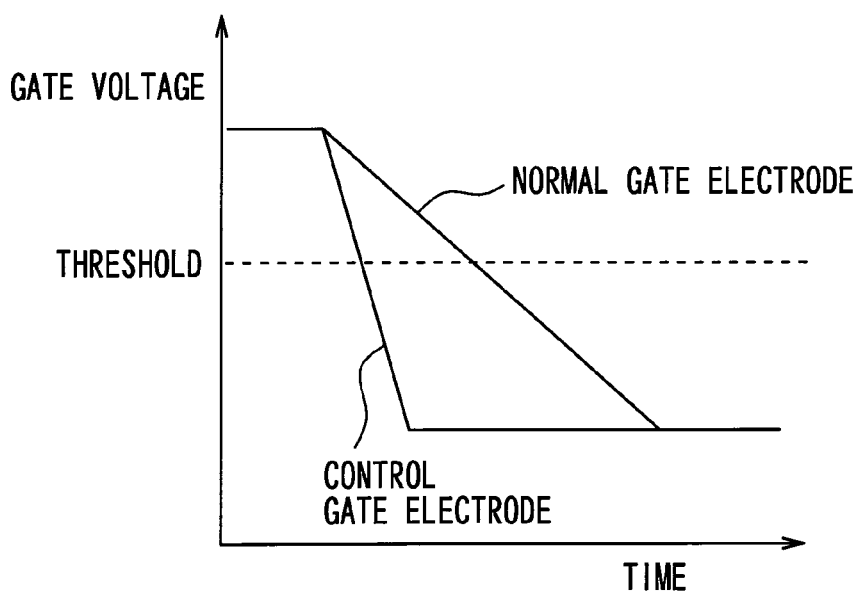
FIG. 4B is a diagram illustrating a relationship between a gate voltage and a time when a turn-off voltage is applied.

Next, the turn-off of the IGBT element is described with reference to FIG. 4B. When the IGBT element is to be turned off, the gate control circuit 30 applies a turn-off voltage to the normal gate electrode 17a through the first resistor R1 while applying the turn-off voltage to the control gate electrode 17b through the second resistor R2. Accordingly, a rate of decrease in charge stored in the gate capacitance of the normal gate electrode 17a becomes smaller than a rate of decrease in charge stored in the gate capacitance of the control gate electrode 17b. That is, a rate of decrease in the gate voltage of the normal gate electrode 17a becomes smaller than a rate of decrease in the gate voltage of the control gate electrode 17b.

Therefore, the gate voltage of the control gate electrode 17b falls below the threshold voltage before the gate voltage of the normal gate electrode 17a, and the inversion layer produced in the portion of the base layer 14 in contact with the trench 15 filled with the control gate electrode 17b disappears firstly. Then, a channel for the holes in the base layer 14 is expanded, a part of the holes stored in the drift layer 13 are ejected from the emitter electrode 23 through the base layer 14 and the body layer 21, and the collector current decreases.

After that, when the gate voltage of the normal gate electrode 17a falls below the threshold voltage, the inversion layer produced in the portion of the base layer 14 in contact with the trench 15 filled with the normal gate electrode 17a disappears. Then, a channel for the holes in the base layer 14 is expanded, the holes stored in the drift layer 13 are ejected from the emitter electrode 23 through the base layer 14 and the body layer 21, and the collector current becomes zero.

That is, the gate voltage of each of the gate electrodes 17a, 17b is caused to fall below the threshold voltage at a different time so that the collector current can be reduced stepwise. In such an approach, the magnitude of the surge voltage can be reduced as compared to when the gate voltage of each of the gate electrodes 17a, 17b is caused to fall below the threshold voltage at a time.

As described above, according to the present embodiment, the emitter layer 20 is not in contact with the side surface of the trench 15 filled with the control gate electrode 17b. For this reason, even when the turn-on voltage is applied to the control gate electrode 17b so that the gate voltage of the control gate electrode 17b can exceed the threshold voltage, electrons are not supplied to the drift layer 13, and the IGBT element is not turned on. That is, the turn-on of the IGBT element is controlled by the normal gate electrode 17a whose gate voltage increases at a rate smaller than a rate at which the gate voltage of the control gate electrode 17b increases. Thus, the surge voltage at the time of the turn-on of the IGBT element can be reduced while the surge voltage at the time of the turn-off is reduced.

Further, the gate electrodes 17a, 17b alternate in the direction perpendicular to the direction in which the trenches 15 extend. Accordingly, electrons can be evenly supplied to the drift layer 13 at the time of the turn-on, and holes can be evenly ejected from the drift layer 13 at the time of the turn-off. Thus, it is possible to prevent the electrons or holes from being concentrated in a specific region of the drift layer 13. Therefore, it is possible to prevent a current concentration capable of destroying the IGBT element from occurring.

Second Embodiment

A second embodiment of the present disclosure is described. The present embodiment differs from the first embodiment in that the first and second resistors R1, R2 are incorporated in the semiconductor chip 10. Since the others are the same as those of the first embodiment, their description is omitted here.

Figure 5:
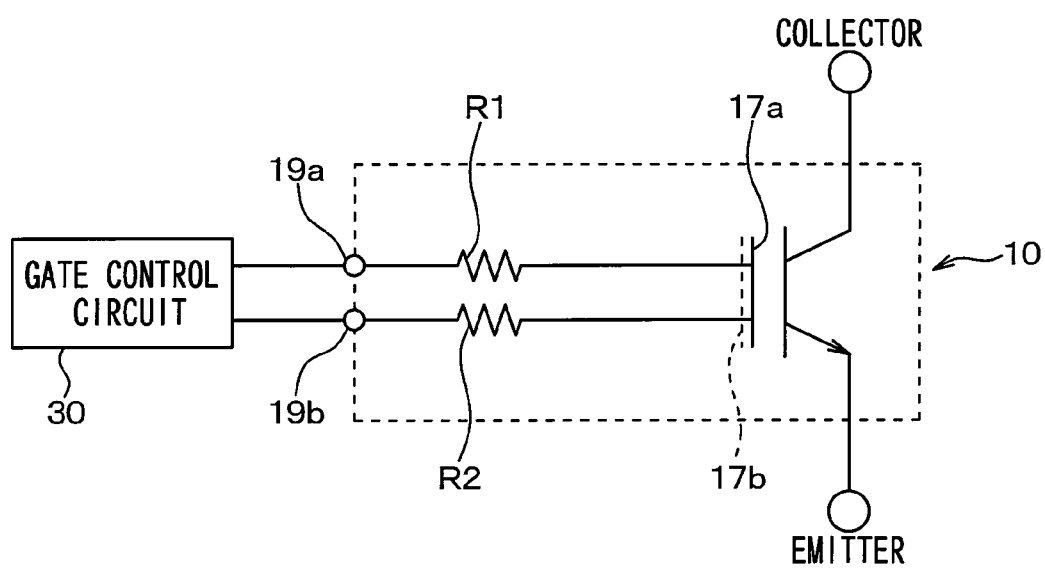
FIG. 5 is a diagram illustrating a circuit structure of a semiconductor device according to a second embodiment of the present disclosure.

As shown in FIG. 5, according to the present embodiment, the normal gate electrode 17a is connected to the normal gate pad 19a through the first resistor R1, and the control gate electrode 17b is connected to the control gate pad 19b through the second resistor R2. That is, the first and second resistors R1, R2 are incorporated in the semiconductor chip 10.

The first and second resistors R1, R2 are formed by changing the material of which the gate wire 18 is made. For example, the gate wire 18 connecting the normal gate electrode 17a to the normal gate pad 19a can be made of polysilicon while the gate wire 18 connecting the control gate electrode 17b to the control gate pad 19b can be made of metal such as aluminum, gold, silver, etc. In such an approach, the first and second resistors R1, R2 can be formed so that the resistance of the second resistor R2 can be smaller than the resistance of the first resistor R1.

Even when the first and second resistors R1, R2 are incorporated in the semiconductor chip 10, a predetermined voltage is applied to the normal gate electrode 17a through the first resistor R1 and applied to the control gate electrode 17b through the second resistor R2. Since the emitter layer 20 is not in contact with the side surface of the trench 15 filled with the control gate electrode 17b, the same effects as in the first embodiment can be obtained.

(Modifications)

While the present disclosure has been described with reference to embodiments thereof, it is to be understood that the disclosure is not limited to the embodiments. The present disclosure is intended to cover various modifications and equivalent arrangements within the spirit and scope of the present disclosure.

The embodiments are based on assumption that a first conductivity type is N-type, and a second conductivity type is P-type. Alternatively, a first conductivity type can be P-type, and a second conductivity type can be N-type.

In the embodiments, the IGBT element is of a trench gate type. Alternatively, the IGBT element can be of a planar gate type. In this case, like in the embodiments, the magnitude of the surge voltage at the time of the turn-on can be reduced by forming the emitter layer 20 so that the emitter layer 20 cannot be in contact with the gate insulation layer 16 provided with the control gate electrode 17b.

In the embodiments, the IGBT element is of a vertical type in which a current flows in a thickness direction of the drift layer 13. Alternatively, the IGBT element can be of a lateral type in which a current flows in a planar direction of the drift layer 13.

In the embodiments, the normal gate electrode 17a and the control gate electrode 17b are arranged to form a stripe structure. Alternatively, ends of each of the gate electrodes 17a, 17b which extend in parallel can be joined to form a ring structure. That is, ends of each of the trenches 15 which extend in parallel can be joined to form a ring structure.

Figure 6:
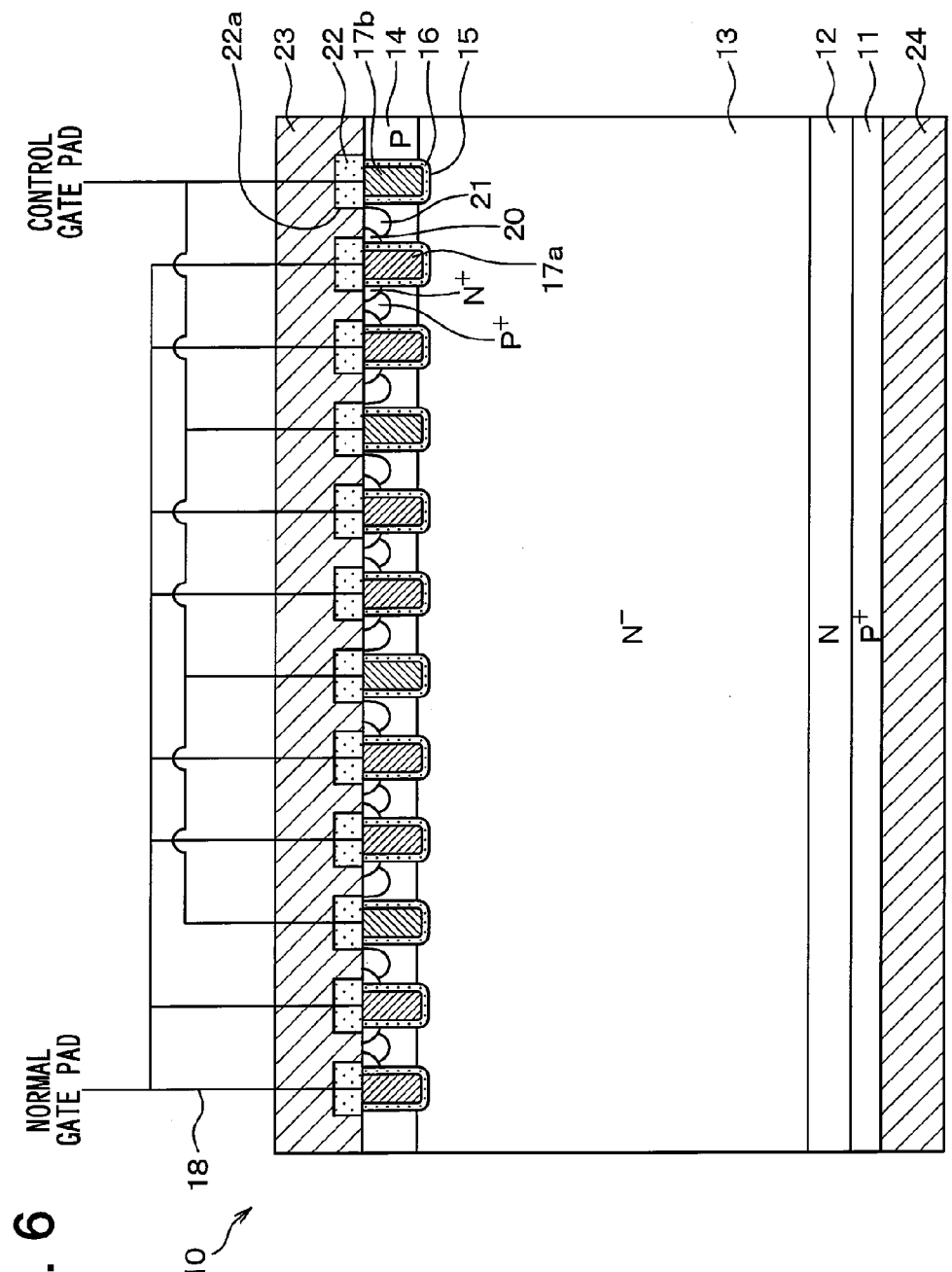
FIG. 6 is a cross sectional view of a semiconductor chip according to another embodiment of the present disclosure.

In the embodiments, the normal gate electrode 17a and the control gate electrode 17b alternate in the direction perpendicular to the direction in which the trenches 15 extend. Alternatively, the normal gate electrode 17a and the control gate electrode 17b can be arranged in a manner described below. FIG. 6 is a diagram illustrating a cross sectional view of the semiconductor chip 10 according to a modification.

As shown in FIG. 6, one control gate electrode 17b can be provided for every two normal gate electrodes 17a. Further, although not shown in the drawings, one control gate electrode 17b can be provided for every three normal gate electrodes 17a or every four normal gate electrodes 17a. Furthermore, for example, in the direction perpendicular to the extension direction, the normal gate electrodes 17a can be collectively arranged on one side while the control gate electrodes 17b can be collectively arranged on the other side. That is, as long as the IGBT element has the control gate electrode 17b, the surge voltage at the time of the turn-off can be reduced. Further, the surge voltage at the time of the turn-on can be reduced by forming the emitter layer 20 so that the emitter layer 20 cannot be in contact with the side surface of the trench 15 filled with the control gate electrode 17b.

Figure 7:
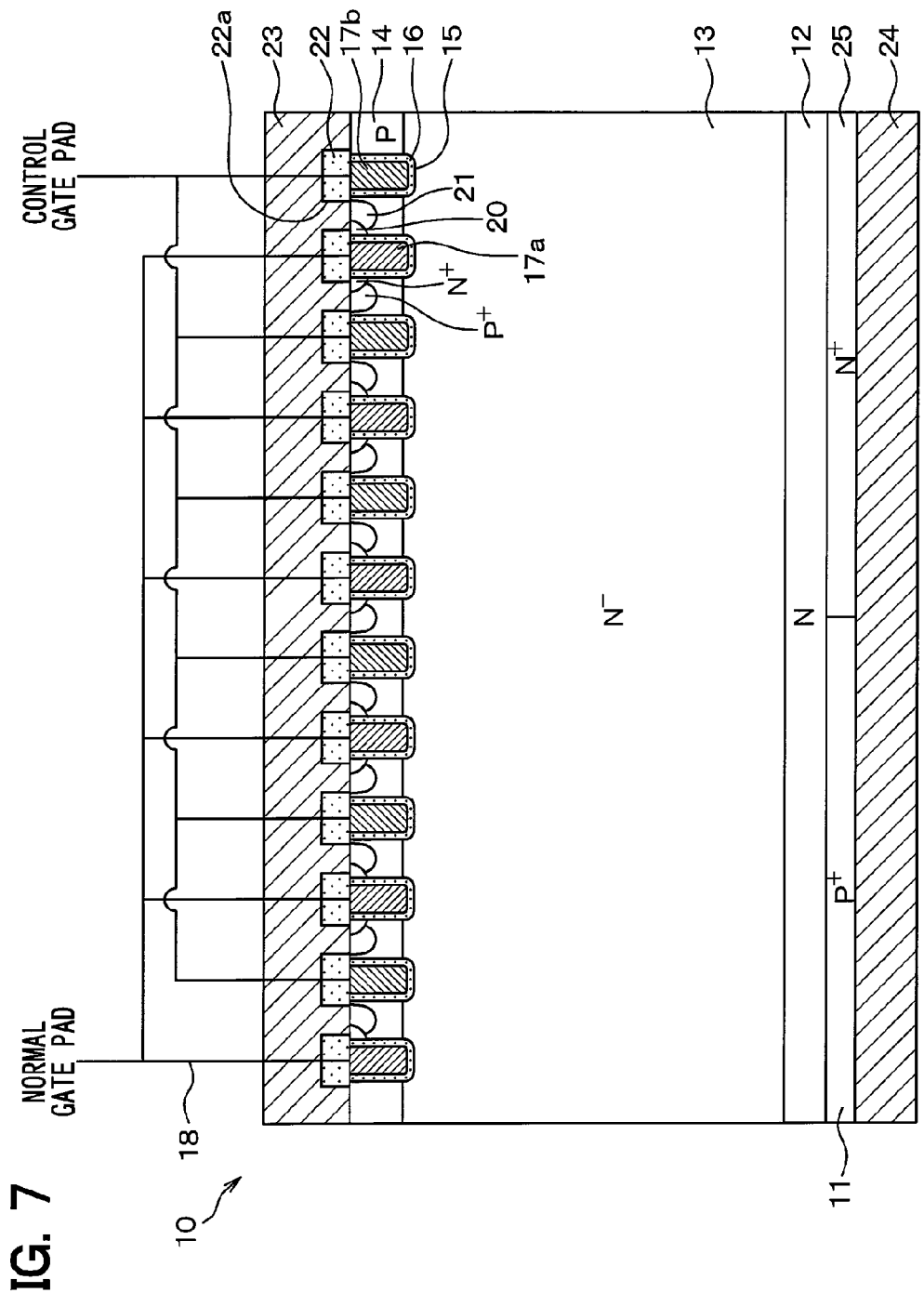
FIG. 7 is a cross sectional view of a semiconductor chip according to another embodiment of the present disclosure.

As shown in FIG. 7, the embodiments can be modified so that an $N^+$-type cathode layer 25 adjacent to the collector layer 11 can be formed and that the drift layer 13 can be formed on the collector layer 11 and the cathode layer 25. That is, the present disclosure can be applied to a so-called RC (Reverse-conducting)—IGBT element in which a region where the collector layer 11 is formed is used as an IGBT region and a region where the cathode layer 25 is formed is used as a diode region. In this case, for example, the collector layer 11 and the cathode layer 25 can be formed in a grid pattern.

In the second embodiment, the semiconductor chip 10 has both the normal gate pad 19a and the control gate pad 19b. Alternatively, the normal gate electrode 17a and the control gate electrode 17b can be connected together to a common gate pad. Even in such a structure, since a predetermined voltage is applied to the normal gate electrode 17a through the first resistor R1 and applied to the control gate electrode 17b through the second resistor R2, the same effects as in the second embodiment can be obtained.

In the embodiments, the normal gate electrode 17a is connected to the gate control circuit 30 through the first resistor R1, and the control gate electrode 17b is connected to the gate control circuit 30 through the second resistor R2 so that the rate of change in the gate voltage of the normal gate electrode 17a can be smaller than the rate of change in the gate voltage of the control gate electrode 17b. Alternatively, the rate of change in the gate voltage of the normal gate electrode 17a can be made smaller than the rate of change in the gate voltage of the control gate electrode 17b, for example, by connecting an external capacitor, etc.

What is claimed is:
1. A semiconductor device comprising:
a first conductivity-type drift layer;
a second conductivity-type base layer formed in a front surface portion of the drift layer;
a second conductivity-type collector layer formed in the drift layer and separated from the base layer;
a plurality of gate insulation layers formed on a surface of the base layer;
a plurality of gate electrodes individually formed on the plurality of gate insulation layers;
an emitter layer formed in a front surface portion of the base layer;

an emitter electrode electrically connected to the emitter layer and the base layer; and a collector electrode electrically connected to the collector layer, wherein the plurality of gate electrodes are configured such that a rate of change in a gate voltage of each gate electrode in a part of the plurality of gate electrodes is smaller than a rate of change in a gate voltage of each gate electrode in a remainder of the plurality of gate electrodes, the emitter layer is in contact with each gate insulation layer provided with the part of the plurality of gate electrodes, the emitter layer is not in contact with each gate insulation layer provided with the remainder of the plurality of gate electrodes, each gate electrode of the group of the plurality of electrodes is connected to a first resistor, each gate electrode of the remainder of the plurality of gate electrodes being connected to a second resistor, and a resistance of the second resistor is smaller than that of the first resistor.

2. The semiconductor device according to claim 1, further comprising:

a plurality of trenches reaching the drift layer by penetrating the base layer, the plurality of trenches extending in a predetermined direction, wherein the collector layer is located on a back surface side of the drift layer, the back surface side being opposite to the front surface portion side, each gate insulation layer is formed in a wall surface of a corresponding one of the plurality of trenches, the emitter layer is in contact with a side surface of each of the plurality of trenches provided with the part of the plurality of gate electrodes, and the emitter layer is not in contact with a side surface of each of the plurality of trenches provided with the remainder of the plurality of gate electrodes.

3. The semiconductor device according to claim 2, wherein the part of the plurality of gate electrodes alternates with the remainder of the plurality of gate electrodes in a direction perpendicular to the predetermined direction.

4. The semiconductor device according to claim 1, further comprising:

a first conductivity-type cathode layer adjacent to the collector layer.

* * * * *